US010523235B2

(12) United States Patent
Liu

(10) Patent No.: US 10,523,235 B2
(45) Date of Patent: Dec. 31, 2019

(54) TRANSMISSION CHECKING METHOD, NODE, SYSTEM AND COMPUTER STORAGE MEDIUM

(71) Applicant: Sanechips Technology Co., Ltd., Shenzhen,Guangong (CN)

(72) Inventor: Xinliang Liu, Shenzhen (CN)

(73) Assignee: Sanechips Technology Co., Ltd., Shenzhen, Guangdong Province (CN)

( * ) Notice: Subject to any disclaimer, the term of this patent is extended or adjusted under 35 U.S.C. 154(b) by 148 days.

(21) Appl. No.: 15/574,718

(22) PCT Filed: Jun. 1, 2016

(86) PCT No.: PCT/CN2016/084314
§ 371 (c)(1),
(2) Date: Nov. 16, 2017

(87) PCT Pub. No.: WO2017/000737
PCT Pub. Date: Jan. 5, 2017

(65) Prior Publication Data

US 2018/0138922 A1 May 17, 2018

(30) Foreign Application Priority Data

Jun. 30, 2015 (CN) .......................... 2015 1 0374614

(51) Int. Cl.
*H03M 13/09* (2006.01)
*H04B 17/30* (2015.01)
(Continued)

(52) U.S. Cl.
CPC .............. *H03M 13/09* (2013.01); *H03K 5/13* (2013.01); *H04B 17/30* (2015.01); *H04L 1/00* (2013.01);
(Continued)

(58) Field of Classification Search
CPC ... H04L 1/00; H04L 7/10; H04L 12/40; H04L 12/40045
See application file for complete search history.

(56) References Cited

U.S. PATENT DOCUMENTS 7,570,708 B2 8/2009 Laturell
8,050,333 B2 11/2011 Muto
(Continued)

FOREIGN PATENT DOCUMENTS

CN 1859358 A 11/2006
CN 2938595 Y 8/2007
(Continued)

OTHER PUBLICATIONS

International Search Report in international application No. PCT/2016/084314, dated Aug. 26, 2016, 2 pgs.
(Continued)

*Primary Examiner* — Gbemileke J Onamuti
(74) *Attorney, Agent, or Firm* — Ling Wu; Stephen Yang; Ling and Yang Intellectual Property

(57) ABSTRACT

Disclosed in the embodiments of the disclosure are a transmission checking method, node, system and computer storage medium. The method comprises: transmitting, by a SERializer/DESerializer (SERDES) transmitter, a first synchronization frame to a SERDES receiver; after the SERDES receiver receives the first synchronization frame, transmitting a second synchronization frame to the SERDES transmitter; and after the SERDES transmitter receives the second synchronization frame, transmitting a third synchronization frame to the SERDES receiver, such that the SERDES transmitter and the SERDES receiver can determine that a transmitting path and a receiving path of the SERDES transmitter and the SERDES receiver are in a normal state respectively.

6 Claims, 4 Drawing Sheets

A_tx s k s k s k s k s k ... k s k ... k D k ...
Step 1 Step 2 Step 3
A_rx k s k s k s k ... k s k ... k s k D k ...
... k D k s k ... k s k ... k s k s k s k s k B_rx
Step 3 Step 2 Step 1
D k D k ... k s k ... k s k s k s k s k s B_tx

(51) Int. Cl.

| | |
|---|---|
| ***H03K 5/13*** | (2014.01) |
| ***H04L 1/00*** | (2006.01) |
| ***H04L 12/40*** | (2006.01) |
| ***H04L 7/10*** | (2006.01) |
| *H03M 9/00* | (2006.01) |
| *H04J 3/06* | (2006.01) |

(52) U.S. Cl.

CPC ................ *H04L 7/10* (2013.01); *H04L 12/40* (2013.01); *H04L 12/40045* (2013.01); *H03M 9/00* (2013.01); *H04J 3/0658* (2013.01)

(56) References Cited

U.S. PATENT DOCUMENTS

| | | | |
|---|---|---|---|
| 8,094,705 B2 | 1/2012 | Watkins | |
| 8,116,409 B1 | 2/2012 | Warner | |
| 2006/0184831 A1 | 8/2006 | Lesartre | |
| 2006/0268723 A1 | 11/2006 | Vogel | |
| 2011/0179315 A1 | 7/2011 | Yang | |
| 2015/0143316 A1 * | 5/2015 | Hosny | G06F 17/5072 716/113 |

FOREIGN PATENT DOCUMENTS

| | | |
|---|---|---|
| CN | 101276317 A | 10/2008 |
| CN | 101291148 A | 10/2008 |
| CN | 101442380 A | 5/2009 |
| CN | 101448029 A | 6/2009 |
| CN | 102594484 A | 7/2012 |
| CN | 103401551 A | 11/2013 |
| CN | 103716118 A | 4/2014 |
| CN | 104009823 A | 8/2014 |
| EP | 1298833 A2 | 4/2003 |

OTHER PUBLICATIONS

English Translation of the Written Opinion of the International Search Authority in international application No. PCT/CN2016/084314, dated Aug. 26, 2016, 6 pgs.

Supplementary European Search Report in European application No. 16817101.5, dated Jun. 6, 2018, 8 pgs.

“Interlaken Protocol Definition a Joint Specification of Cortina Systems and Cisco Systems”, Oct. 2008, Oct. 7, 2008, No. Revision 1.2 7 Retrieved from the Internet:URL: http: //www.interlakenalliance.com/ Interlaken_Protocol_Definitionv1.2.pdf, pp. 1-52.

* cited by examiner

TRANSMISSION CHECKING METHOD, NODE, SYSTEM AND COMPUTER STORAGE MEDIUM

TECHNICAL FIELD

The present disclosure relates to data communication interface technologies, and more particularly, to a transmission checking method, node, system and computer storage medium.

BACKGROUND

SERDES is short for a SERializer/DESerializer. It is the mainstream of Time Division Multiplexing (TDM) and Point-to-Point (P2P) serial communication technology. That is, multiple paths of low-speed parallel signals are converted at a transmitter into high-speed serial signals and then are transmitted by a transmission medium (an optical cable or a copper wire). At last, the high-speed serial signals are reconverted at a receiver into the low-speed parallel signals. The SERDES has the characteristics of high speed, high precision, less pins, low power consumption and the like and therefore is widely used in a modern communication chip. In a system for performing inter-board or inter-chip communication using the SERDES, it is frequent to encounter a problem that the SERDES is unstable. Such phenomenon, on one hand, may be caused by internal reasons such as a SERDES reference clock being unstable and on the other hand, may be resulted from external reasons such as the on-board routing not meeting the requirement. In a word, the data communication of the SERDES is closely associated with external conditions required by the operation of the SERDES. The external conditions such as a clock, a reset, a power voltage, a magnetic field and an electric field may have an influence on the stability of the SERDES and such influence is not utterly predictable.

However, there is no any existing effect solution in the related art to solve the problem of how to guarantee the stability of a SERDES path and provide reliable data transmission.

SUMMARY

To solve the technical problem in the related art, the embodiments of the disclosure provide a transmission checking method, node, system and computer storage medium that can improve the stability and the reliability of the SERDES path.

To this end, the technical solutions of the embodiments of the disclosure are implemented as follows.

The embodiments of the disclosure provide a transmission checking method, and the method includes the following steps.

A SERDES transmitter transmits a first synchronization frame to a SERDES receiver. Upon reception of a second synchronization frame transmitted from the SERDES receiver, the SERDES transmitter determines that each of a transmitting path and a receiving path of the SERDES transmitter is in a normal state.

The SERDES transmitter transmits a third synchronization frame to the SERDES receiver.

According to an embodiment, a first identification tag and a second identification tag are provided in a Frame Header (FH) of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

An embodiment of the disclosure further provides a transmission checking method, and the method includes the following steps.

A SERDES receiver transmits a second synchronization frame to a SERDES transmitter upon reception of a first synchronization frame transmitted from the SERDES transmitter.

Upon reception of a third synchronization frame transmitted from the SERDES transmitter, the SERDES receiver determines that each of a transmitting path and a receiving path of the SERDES receiver is in a normal state.

According to an embodiment, a first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

An embodiment of the disclosure further provides a transmission checking method, and the method includes the following steps.

A SERDES transmitter transmits a first synchronization frame to a SERDES receiver.

The SERDES receiver transmits a second synchronization frame to the SERDES transmitter upon reception of the first synchronization frame.

Upon reception of the second synchronization frame, the SERDES transmitter determines that each of a transmitting path and a receiving path of the SERDES transmitter is in a normal state, and transmits a third synchronization frame to the SERDES receiver.

Upon reception of the third synchronization frame, the SERDES receiver determines that each of a transmitting path and a receiving path of the SERDES receiver is in the normal state.

According to an embodiment, a first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

According to an embodiment, transmitting, by the SERDES transmitter, the first synchronization frame to the SERDES receiver includes: the SERDES transmitter transmits a plurality of the first synchronization frames and K codes in a manner of alternating one of the first synchronization frames with one of the K codes.

Accordingly, the SERDES receiver judges whether the receiving path is in the normal state based on whether the K codes are decoded.

An embodiment of the disclosure further provides a SERDES transmitter, and the SERDES transmitter includes: a first transmitting unit and a first receiving unit.

The first transmitting unit is configured to transmit a first synchronization frame to a SERDES receiver, and is further configured to transmit a third synchronization frame to the SERDES receiver upon that the first receiving unit receives a second synchronization frame.

The first receiving unit is configured to receive the second synchronization frame transmitted from the SERDES receiver.

According to an embodiment, a first identification tag and a second identification tag are provided in an FH of each of the first synchronization frame, the second synchronization frame and the third synchronization frame. When the first identification tag is set to be a preset value, it is indicated that the receiving path of a local terminal is in the normal state. When the second identification tag is set to be a preset value, it is indicated that the receiving path of a peer terminal is in the normal state.

An embodiment of the disclosure further provides a SERDES receiver, and the SERDES receiver includes a second transmitting unit and a second receiving unit.

The second receiving unit is configured to receive a first synchronization frame transmitted from a SERDES transmitter, and is further configured to receive a third synchronization frame transmitted from the SERDES transmitter.

The second transmitting unit is configured to transmit a second synchronization frame to the SERDES transmitter upon that the second receiving unit receives the first synchronization frame.

According to an embodiment, a first identification tag and a second identification tag are provided in an FH of each of the first synchronization frame, the second synchronization frame and the third synchronization frame. When the first identification tag is set to be a preset value, it is indicated that the receiving path of a local terminal is in the normal state. When the second identification tag is set to be a preset value, it is indicated that the receiving path of a peer terminal is in the normal state.

An embodiment of the disclosure further provides a transmission checking system, and the system includes a SERDES transmitter and a SERDES receiver.

The SERDES transmitter is configured to transmit a first synchronization frame to the SERDES receiver, and is further configured to, upon reception of a second synchronization frame transmitted from the SERDES receiver, determine that each of a transmitting path and a receiving path of the SERDES transmitter is in a normal state, and transmit a third synchronization frame to the SERDES receiver.

The SERDES receiver is configured to transmit the second synchronization frame to the SERDES transmitter upon reception of the first synchronization frame transmitted from the SERDES transmitter, and is further configured to determine that each of a transmitting path and a receiving path of the SERDES receiver is in the normal state upon reception of the third synchronization frame transmitted from the SERDES transmitter.

According to an embodiment, a first identification tag and a second identification tag are provided in an FH of each of the first synchronization frame, the second synchronization frame and the third synchronization frame. When the first identification tag is set to be a preset value, it is indicated that the receiving path of a local terminal is in the normal state. When the second identification tag is set to be a preset value, it is indicated that the receiving path of a peer terminal is in the normal state.

According to an embodiment, the SERDES transmitter is configured to transmit a plurality of the first synchronization frames and K codes in a manner of alternating one of the first synchronization frames with one of the K codes.

Accordingly, the SERDES receiver is configured to judge whether the receiving path is in the normal state based on whether the K codes are decoded.

An embodiment of the disclosure further provides a computer storage medium. A computer executable instruction is stored in the computer storage medium. The computer executable instruction is used to execute a transmission checking method applied to a SERDES transmitter in the embodiments of the disclosure.

An embodiment of the disclosure further provides a computer storage medium. A computer executable instruction is stored in the computer storage medium. The computer executable instruction is used to execute a transmission checking method applied to a SERDES receiver in the embodiments of the disclosure.

According to the transmission checking method, node, system and computer storage medium provided by the embodiments of the disclosure, the SERDES transmitter transmits the first synchronization frame to the SERDES receiver. Upon reception of the first synchronization frame, the SERDES receiver transmits the second synchronization frame to the SERDES transmitter. Upon reception of the second synchronization frame, the SERDES transmitter determines that each of the transmitting path and the receiving path of the SERDES transmitter is in the normal state, and transmits the third synchronization frame to the SERDES receiver. Upon reception of the third synchronization frame, the SERDES receiver determines that each of the transmitting path and the receiving path of the SERDES receiver is in the normal state. Therefore, according to the technical solutions of the embodiments of the disclosure, through three handshaking processes of mutually transmitting the three synchronization frames by the two SERDES ends, each of the SERDES transmitter and the SERDES receiver can determine whether the receiving path and the transmitting path of the SERDES transmitter/the SERDES receiver are in the normal state. Therefore, the security of the data transmission is greatly improved, the SERDES path is guaranteed to be stable, and the experience of a user is improved.

DETAILED DESCRIPTION

Figure 1:
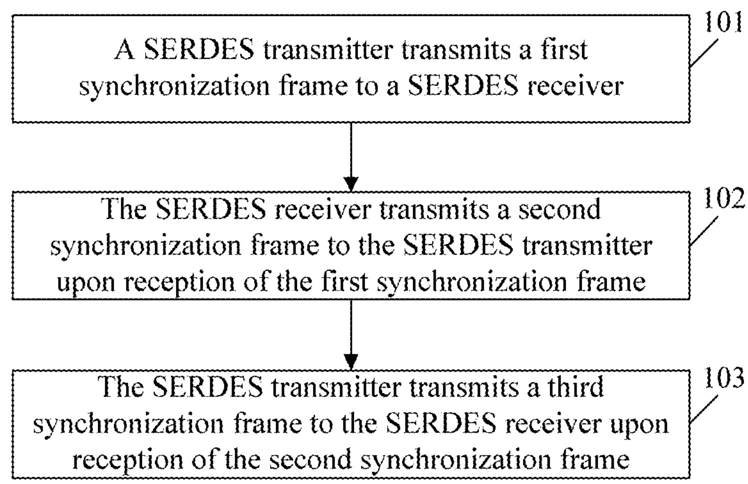
FIG. 1 is a flowchart of a transmission checking method in a first embodiment of the disclosure.

The disclosure will be further described below in detail with reference to accompanying drawings and specific embodiments.

In order to guarantee the stability of the SERDES path in embodiments of the present disclosure, the inventor finds, in practice, it is extremely unreliable to judge the working state of the SERDES based on, for example, a signal regarding to the synchronization state of the SERDES. The synchronization of the SERDES needs a certain time to be stable, and thus sometimes the synchronization state of the SERDES is pulled up and then is pulled down. But at last, the synchronization state should be high. Furthermore, there is another case that one end of the SERDES path is in the normal state but the other end is still unstable, and there even has the case that the error state of the SERDES at a certain end is mistakenly and continuously reported. As indicated from the above scenes, the normal synchronization state of the SERDES does not represent that the SERDES has been stable and the synchronization state herein further may be repeated within a period of time. On the other hand, the normal or stable state at one end of the SERDES path does not indicate that the other end is also normal or stable. To sum up, when we determine whether the data could be transmitted merely based on the signals such as the synchronization state of the SERDES, it is likely to occur that the SERDES path is still in an unstable state; that is to say, the correct data cannot be received by the receiver.

In addition, as there is no stipulated handshaking signal for the data transmission of the SERDES, the condition of the data transmission cannot be known by means of an immediate feedback. For example, at the SERDES transmitter, when the data transmitted by the SERDES reaches to the SERDES receiver, the receiver cannot immediately notify the SERDES transmitter of that the data has been received. The SERDES receiver only can employ a manner of transmitting a response data and transmits to the SERDES transmitter using the SERDES path, such that the SERDES transmitter of the data knows that the SERDES receiver has received the data. According to the phenomenon that the SERDES receiver receives the response data, it further may be concluded that compared with the SERDES transmitter in itself, the transmitting path and the receiving path of the SERDES path all may normally receive and transmit the data. So how can the SERDES receiver know that the SERDES path is normal? Currently, the SERDES receiver only can receive a data packet and it is unclear that whether the data packet transmitted from the SERDES receiver can be received by the SERDES receiver. As long as the SERDES transmitter receives the response data returned by the SERDES receiver and then transmits a “responded response message” to the SERDES receiver, and the SERDES receiver receives the “responded response message”, it can be known that, compared with the SERDES receiver in itself, the transmitting path and the receiving path of the SERDES path are normal too. Through the handshaking process of mutually transmitting the response data packet, the two ends of the SERDES path both can confirm whether the SERDES path is in the normal state.

In view of this, the following embodiments of the disclosure are provided.

First Embodiment

The embodiments of the disclosure provide a transmission checking method. FIG. 1 is a flowchart of a transmission checking method in a first embodiment of the disclosure. As shown in FIG. 1, the method includes the following steps.

In step 101: a SERDES transmitter transmits a first synchronization frame to a SERDES receiver.

In step 102: the SERDES receiver transmits a second synchronization frame to the SERDES transmitter upon reception of the first synchronization frame.

In step 103: the SERDES transmitter transmits a third synchronization frame to the SERDES receiver upon reception of the second synchronization frame, such that the SERDES transmitter and the SERDES receiver determine that each of a transmitting path and a receiving path of the SERDES transmitter and the SERDES receiver is in a normal state.

In the embodiment here, the SERDES transmitter and the SERDES receiver are two ends of the SERDES path respectively. The SERDES includes a SERializer and a DESerializer. The SERializer may be called as the SERDES transmitter (TX) in the embodiment, and the DESerializer may be called as the SERDES receiver (RX) in the embodiment, so as to implement that multiple paths of low-speed parallel signals are converted at the transmitter into high-speed serial signals and are transmitted by a transmission medium (an optical cable or a copper wire), and at the receiver, the high-speed serial signals are reconverted into the low-speed parallel signals.

Figure 2:
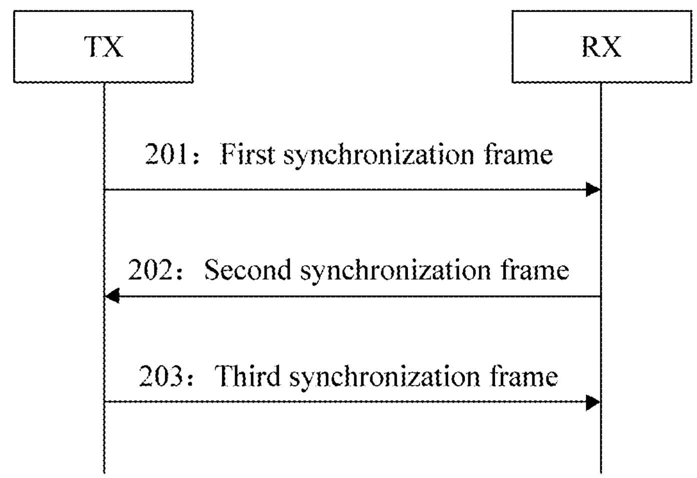
FIG. 2 is an interaction diagram of a transmission checking method in a first embodiment of the disclosure.

FIG. 2 is an interaction diagram of a transmission checking method in a first embodiment of the disclosure. The interaction between the SERDES transmitter and the SERDES receiver specifically may be as shown in FIG. 2. The transmission checking method for the SERDES in the embodiment includes the following steps.

In step 201: when the SERDES transmitter detects that it is in a normal state currently, a first synchronization frame is transmitted. The first synchronization frame in the embodiment is denoted as pattern0.

In step 202: upon reception of the pattern0, the SERDES receiver can determine that a receiving path of the SERDES receiver is in the normal state on one hand and on the other hand also can know that a transmitting path of the SERDES transmitter is in the normal state. Further, the SERDES receiver transmits a second synchronization frame to the SERDES transmitter. The second synchronization frame in the embodiment is denoted as pattern1.

In step 203: upon reception of the pattern1, the SERDES transmitter can determine that the transmitting path and the receiving path of the SERDES transmitter both are in the normal state on one hand and on the other hand also can determine that the transmitting path of the SERDES receiver is in the normal state. Further, the SERDES transmitter transmits a third synchronization frame to the SERDES receiver. The third synchronization frame in the embodiment is denoted as pattern2. Upon reception of the pattern2, the SERDES can determine that the receiving path and the transmitting path of the SERDES both are in the normal state.

In view of this, according to the embodiment of the disclosure here, through three handshaking processes of transmitting the first synchronization frame, receiving the second synchronization frame and transmitting the third synchronization frame, each of the SERDES transmitter and the SERDES receiver can determine whether its the receiving channel and the transmitting channel are in the normal state, so the security of the data transmission is greatly improved.

By adopting the technical solutions of the embodiment of the disclosure, and through the three handshaking processes of mutually transmitting the three synchronization frames by the two SERDES ends, each of the SERDES transmitter and the SERDES receiver can determine whether its the receiving path and the transmitting path are in the normal state. Therefore, the security of the data transmission is greatly improved, the SERDES path is guaranteed to be stable, and the experience of a user is improved.

Second Embodiment

Based on the transmission checking method provided by the first embodiment, in the embodiment here, a first identification tag and a second identification tag are provided in an FH of each of the first synchronization frame, the second synchronization frame and the third synchronization frame. When the first identification tag is set to be a preset value, it is indicated that the receiving path of a local terminal is in the normal state. When the second identification tag is set to be a preset value, it is indicated that the receiving path of a peer terminal is in the normal state.

Figure 3:
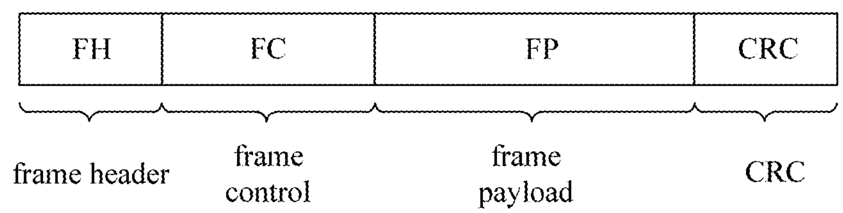
FIG. 3 is a schematic diagram of a frame structure in a second embodiment of the disclosure.

In the embodiment here, each of the first synchronization frame, the second synchronization frame and the third synchronization frame can be called as a synchronization frame. In the embodiment, in additional to the synchronization frames transmitted between the SERDES transmitter and the SERDES receiver, data frames are further transmitted. The synchronization frames and the data frames can be called as private frames in the embodiment. FIG. 3 is a schematic diagram of a frame structure in a second embodiment of the disclosure. As shown in FIG. 3, the frame structure of the private frame includes: the FH, a Frame Control (FC), a Frame Payload (FP) and a Cyclic Redundancy Check (CRC). It is assumed that the bit width of a SERDES interface is 16 bits, and the FP is preferably set such that a length of the data frame can exactly divide the bit width and the requirement of a system on a rate can be met. According to an embodiment, the FP may be 32 bytes. Table 1 is a table illustrating a specific mapping relationship of private frames. As shown in table 1, when the private frame is the synchronization frame, the bit 15 at the FH is set into 0, which indicates that the current frame is the synchronization frame. When the private frame is the synchronization frame, the frame structure does not include an FP domain. When the private frame is the data frame, the bit 15 of the FH is set into 1, which indicates that the current frame is the data frame. The FP domain of the data frame is used to carry user data. In this embodiment, the CRC portion in the frame structure of the private frame is optional and is used to alarm. No matter for the synchronization frame or the data frame, in the data structure, the bit 8 and the bit 7 of the FH carry a tag that indicates whether synchronized. In this embodiment, the bit 8 is used to indicate that a SERDES receiving path of the local terminal has been in character synchronization, whereas the bit 7 is used to indicate that a SERDES receiving path of the peer terminal has been in character synchronization, such that each of the SERDES transmitter and the SERDES receiver may determine that whether its the receiving path and the transmitting path are in the normal state and therefore the transmission of the SERDES is more stable and reliable.

TABLE 1

| Structure name of data packet | Structure position of data packet | Bit | Description |
|---|---|---|---|
| FH | 0 | [15] | Frame type<br>0: synchronization frame<br>1: data frame |
| | | [14:9] | Used to indicate the amplitude of the FP carried<br>The synchronization frame is 0 and the data frame is 32 (both may be adjusted according to the frame size) |
| | | [8] | Indicate that the SERDES receiving path of the local terminal has been in character synchronization |
| | | [7] | Indicate that the SERDES receiving path of the peer terminal has been in character synchronization |
| | | [6:0] | Unused |
| FC | 1 | [15:0] | Used to carry the FC of the data, such as the FH, a frame tail, a block head, a block tail and an error tag |
| FP | 2:(n + 2) | [15:0] | FP of user data; when it is the synchronization frame, this field is null. |
| CRC | (n + 2):(n + 3) | [15:0] | |

According to an embodiment of the disclosure, in the process of transmitting the user data by means of the SERDES path, namely when the data frames are transmitted, the user data are encapsulated using the frame structure shown in table 1. That is, a tag that indicates whether the local terminal and the peer terminal are synchronous is arranged in the data frame, such that a user determines whether the current SERDES transmitter or SERDES receiver has been synchronized in the data transmission process, thereby guaranteeing the stability and the reliability of the data transmission.

According to another embodiment, transmitting, by the SERDES transmitter, the first synchronization frame to the SERDES receiver includes: the SERDES transmitter transmits a plurality of the first synchronization frames and K codes in a manner of alternating one of the first synchronization frames with one of the K codes.

Accordingly, the SERDES receiver judges whether the receiving path is in the normal state based on whether the K codes are decoded.

Specifically, the SERDES transmitter can transmit a plurality of the first synchronization frames (it is the first synchronization frames in the embodiment and also may be the second synchronization frames or the third synchronization frames in other embodiments) and the K codes in a manner of alternating one of the first synchronization frames with one of the K codes. For example, the synchronization frame, the K code, the synchronization frame, the K code are transmitted in this order. When the SERDES receiver performs decoding, whether the character boundary is correct in the transmission process (namely in a serial-parallel conversion process) is judged based on whether the K codes are obtained by decoding. If the K codes are obtained by the decoding, it is determined that the character boundary in the transmission process is correct. If the K codes are not obtained by the decoding, it is determined that the character boundary in the transmission process is incorrect and there is a need to move one frame length backward. Then after a response time, it is continued to judge whether the K codes are obtained by decoding till the K codes are obtained successfully.

Figure 4:
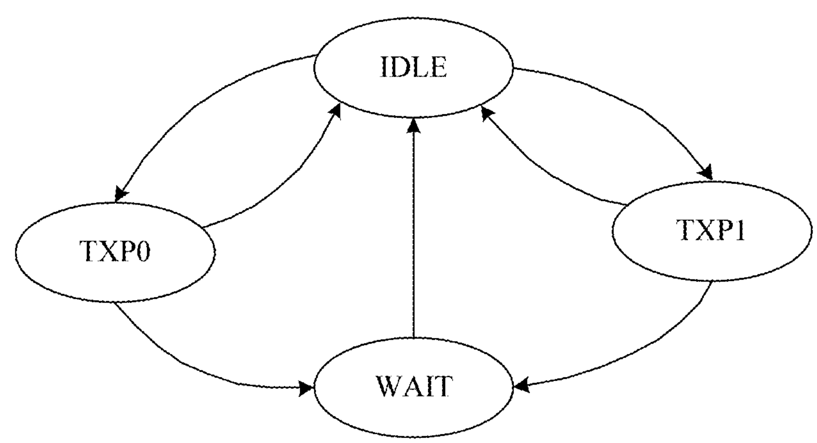
FIG. 4 is a state-based interaction diagram of a transmission checking method in an embodiment of the disclosure.

Based on the transmission checking method provided in the first embodiment and the second embodiment, FIG. 4 is a state-based interaction diagram of a transmission checking method in an embodiment of the disclosure. As shown in FIG. 4, in the embodiment, four states are set in advance: an IDLE state, a TXP0 state, a TXP1 state and a WAIT state.

The IDLE state refers to an initial state after the SERDES completes state synchronization after a power-on reset. In the IDLE state, if one end of the SERDES path does not receive the pattern0 synchronization frame, the state is switched to a transmitting state, namely the TXP0 state, of the pattern0 synchronization frame. If the pattern0 synchronization frame is received in the IDLE state, the state is switched to a transmitting state, namely the TXP1 state, of pattern1 synchronization frame.

The TXP0 state refers to the transmitting state of the pattern0 synchronization frame, in which the pattern0 synchronization frame is transmitted and the pattern1 synchronization frame returned by the peer terminal is waited. When the pattern1 synchronization frame is received, it is indicated that the current transmitting and receiving paths are normal and are switched to the WAIT state. According to an embodiment, in the TXP0 state, it is necessary to continuously transmit the pattern0 synchronization frame till enough pattern0 synchronization frames are received. If no pattern1 synchronization frame is returned within a preset wait time, it is determined that the state is overtime and is jumped to the IDLE state. Meanwhile, the reporting is interrupted.

The TXP1 state refers to the transmitting state of the pattern1 synchronization frame. As the pattern0 synchronization frame has been received, there is a need to return the pattern1 synchronization frame to be confirmed by the peer terminal According to an embodiment, by returning a certain number of the pattern1 synchronization frames, it is indicated that the initial pattern0 synchronization frames have been received and the transmitted pattern2 synchronization frame returned by the peer terminal to be confirmed is waited. Under the TXP1 state, if the TX terminal continuously transmits the pattern2 synchronization frame and the RX terminal receives a certain number of the pattern2 synchronization frames, it is indicated that the whole handshaking process is completed and the state is switched to the WAIT state. However, if no pattern2 synchronization frame is returned within the preset wait time under the TXP1 state, it is determined that the state is overtime and is switched to the IDLE state. Meanwhile, the reporting is interrupted.

The WAIT state refers to a delay-wait state added to prevent the inconsistency of times when the two ends of the SERDES are withdrawn from a handshaking detection mechanism to cause that the detected synchronization frames are leaked to a user interface. Under the WAIT state, when the RX terminal first detects that the pattern2 synchronization frame is received and then no pattern2 packet is received in the continuous preset time (MAX_RX_DELAY), it is indicated that the handshaking process is completed. Then the RX terminal is switched to a normal output path from an automatic detection mechanism and the data frames received from the SERDES are directly output to the user interface. Under the WAIT state, when the time during which the pattern2 synchronization frame is stopped exceeds a longer time (MAX_DELAY) to ensure the two SERDES ends have completed the whole handshaking process, the TX terminal is switched to a normal user path from the automatic detection mechanism. At this point, each of the transmitting and receiving paths of the SERDES can transmit and receive the data frames by transmitting and receiving interfaces of a user layer.

Based on the description of the above four states, in this embodiment, the transmission checking method of the SERDES includes the following steps.

In step 301: after the power-on reset, one end of the SERDES path is in the IDLE state after completing the state synchronization. Under the IDLE state, when no pattern0 synchronization frame is received within a first preset time, the end is switched to the TXP0 state and the pattern0 synchronization frame is transmitted. At this point, the end of the SERDES path is taken as the transmitting (TX) terminal.

In step 302: the other end of the SERDES path is in the IDLE state, and is switched to the transmitting state, namely the TXP1 state, of the pattern1 synchronization frame after receiving the pattern0 synchronization frame in the preset time. At this point, the other end of the SERDES path is taken as the receiving (RX) terminal, and the pattern1 synchronization frame is transmitted to the TX terminal.

In step 303: the TX terminal waits for the pattern1 synchronization frame returned by the RX terminal under the TXP0 state. When the pattern1 synchronization frame is received, it is indicated that the transmitting and receiving paths of the TX terminal are normal. TX terminal are switched to the WAIT state. and transmits the pattern2 synchronization frame to the RX terminal.

In step 304: the RX terminal waits for the transmitted pattern2 synchronization frame returned by the TX terminal to be confirmed under the TXP1 state. After the pattern2 synchronization frame is received, it is indicated that the transmitting and receiving paths of the RX terminal are normal. The RX terminal is switched to the WAIT state, and the handshaking process is completed.

The transmission checking method of the SERDES in the embodiment of the disclosure will be described below in detail in conjunction with specific applications.

Figure 5:
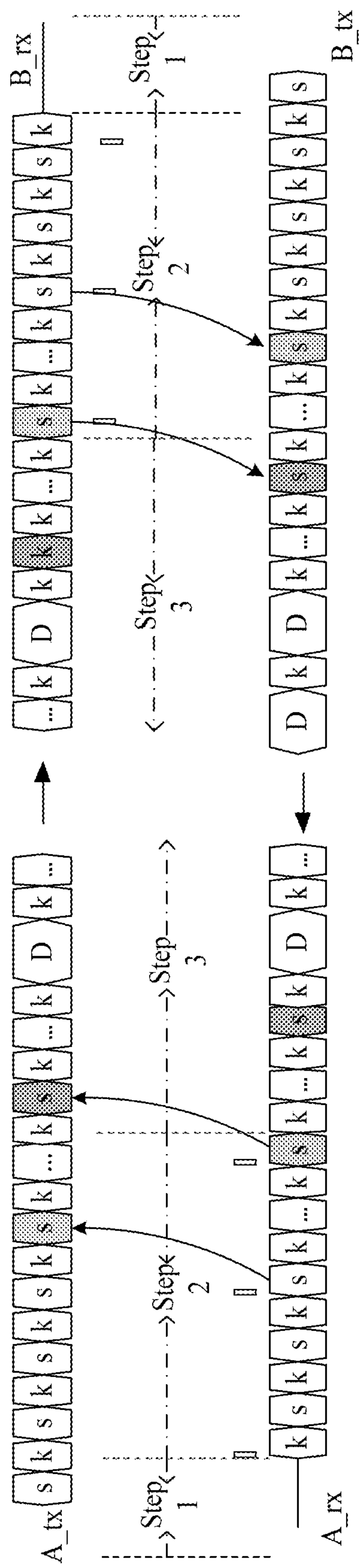
FIG. 5 is an application diagram of a transmission checking method in an embodiment of the disclosure.

FIG. 5 is an application diagram of a transmission checking method in an embodiment of the disclosure. As shown in FIG. 5, there are a node A and a node B. A_rx and A_tx denote represent a receiver and a transmitter of the A node, B_rx and B_tx respectively denote a receiver and a transmitter of the B node. S denotes a synchronization frame. K denotes a K code and D denotes a data frame. As shown in FIG. 5, the method includes three steps.

In step 1: after the A node is reset, the A_tx transmits the synchronization frames and the K codes in a manner of alternating one of the synchronization frames with one of the K codes. The K codes are provided to judge whether the character boundary when the SERDES is in the serial-parallel conversion is correct according to whether the K codes can be decoded by the receiver using an 8B/10B decoding way. When the receiver receives the K codes, it is indicated that the character boundary is correct. When the receiver does not receive the K codes, the character boundary of the A_rx path is configured to move one frame length (UI) backward in sequence. After the response time of the SERDES, the judgment is made continuously till the K codes are successfully received. In the synchronization frames and the K codes transmitted alternately, the number of the K codes transmitted is greater than an N value (the N can be configured in advance and can be configured into 20 for example). When the receiver receives N−1 K codes, it is indicated that the SERDES has completed the character synchronization. With the character synchronization, the correctness of receiving the data is guaranteed. The process here is as shown in ① of FIG. 5 and then is jumped to step 2.

In step 2: the A_tx continuously transmits the synchronization frames and the K codes in a manner of alternating one of the synchronization frames with one of the K codes. If the synchronization frames for three times are continuously detected, the A_rx notifies the A_tx of that the bit 8 at the FHs of the synchronization frames is set into 1, which indicates that the A_rx has at least received the synchronization frames for three times as shown in ② of FIG. 5. When the bit 8 at the FHs of the synchronization frames received by the A_rx is 1, which indicates that the B_rx has at least received the synchronization frames for three times, the A_tx is notified to at least transmit the synchronization frames for one time again with the bit 7 at the FHs being set into 1. When the A_rx receives the synchronization frames with the bit 7 at the FHs being set into 1, it is indicated that the A node knows that both communication parties A_rx and B_rx have been synchronized, namely, the nodes are synchronized. Therefore, each of the transmitting and receiving parties knows that the other party may correctly receive and transmit the data, which increases the security of the data transmission. The process here is as shown in node ③ of FIG. 5 and is jumped to step 3.

In step 3: the A_tx starts to transmit the data frames. The data frames carry time sequence information of the user data. In order to guarantee that an integral data packet is transmitted and received, it is required to transmit from FHs of the user data. At this time, in order to improve the utilization rate of the path, the interspaced K codes may have 1-3 lengths. Meanwhile, on the basis of tags that are carried in the data frames and characterize whether the local terminal and the peer terminal are synchronized, whether the SERDES is synchronized is detected in real time. As there is the K code transmitted every other data frame, the lengths of the data frames plus the K codes can be detected continuously. If the receiver does not decode the K codes, it is considered that the SERDES is in out of synchronization and an alarm is reported. Therefore, with the out-of-synchronization detection, whether the data reaches to the node at the peer terminal securely may be found timely. Meanwhile, the process is jumped to the step 1.

In the schematic diagram, the A node and the B node both are symmetrical nodes, and thus their operations are completely the same. Hence, the transmission checking method of the SERDES based on the B node is not repeated here. Wherein, the CRC check is taken as an optional part of the reliability design, and may assist to check the error code condition of the SERDES. Moreover, a counter is employed to accumulate the number of the frames and error frames transmitted.

By adopting the technical solutions in the embodiments of the disclosure, on one hand, through the three handshaking processes that the two ends of the SERDES mutually transmit the three synchronization frames, each of the SERDES transmitter and the SERDES receiver can determine whether its receiving channel and the transmitting channel are in the normal state. Therefore, the security of the data transmission is greatly improved, the SERDES path is guaranteed to be stable and the experience of the user is improved. On the other hand, when the data frames are transmitted, the tags that indicates that whether the local terminal and the peer terminal are synchronized are encapsulated in the data frames, so as to determine whether the current SERDES transmitter or SERDES receiver has been synchronized in the process of transmitting the user data. Therefore, the stability and the reliability of the data transmission are guaranteed. And at last, by inserting the K codes in the data frames or the synchronization frames, whether the SERDES path is abnormal may be discovered timely and whether the data reaches to the peer terminal securely is found timely, so the security of the data transmission is improved.

Third Embodiment

The embodiments of the disclosure further provide a transmission checking method. The transmission checking method of the SERDES in the embodiment is applied to a transmitter. The method includes the following steps.

In step 401: a SERDES transmitter transmits a first synchronization frame to a SERDES receiver. Upon reception of a second synchronization frame transmitted from the SERDES receiver, the SERDES transmitter determines that each of a transmitting path and a receiving path of the SERDES transmitter is in a normal state.

In step 402: the SERDES transmitter transmits a third synchronization frame to the SERDES receiver.

A first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

Fourth Embodiment

The embodiments of the disclosure further provide a transmission checking method. The transmission checking method of the SERDES in the embodiment is applied to a receiver. The method includes the following steps.

In step 501: a SERDES receiver transmits a second synchronization frame to a SERDES transmitter upon reception of a first synchronization frame transmitted from the SERDES transmitter.

In step 502: upon reception of a third synchronization frame transmitted from the SERDES transmitter, the SERDES receiver determines that a transmitting path and a receiving path of the SERDES receiver are in a normal state.

A first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

The transmission checking method of the SERDES in the third embodiment and the fourth embodiment of the disclosure respectively take the SERDES transmitter and the SERDES receiver as executive bodies to describe the transmission checking method of the SERDES in the embodiments of the disclosure. The specific description in the third embodiment and the fourth embodiment can be referred to that in the first embodiment and the second embodiment and is not repeated here.

Fifth Embodiment

Figure 6:
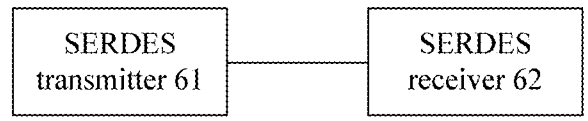
FIG. 6 is a schematic diagram of a compositional structure of a transmission checking system in an embodiment of the disclosure.

The embodiments of the disclosure provide a transmission checking system. FIG. 6 is a systematic diagram of a compositional structure of a transmission checking system in an embodiment of the disclosure. As shown in FIG. 6, the system includes: a SERDES transmitter and a SERDES receiver.

The SERDES transmitter is configured to transmit a first synchronization frame to the SERDES receiver, and is further configured to, upon reception of a second synchronization frame transmitted from the SERDES receiver, determine that each of a transmitting path and a receiving path of the SERDES transmitter is in a normal state, and transmit a third synchronization frame to the SERDES receiver.

The SERDES receiver is configured to transmit the second synchronization frame to the SERDES transmitter upon reception of the first synchronization frame transmitted from the SERDES transmitter, and is further configured to determine that each of a transmitting path and a receiving path of the SERDES receiver is in the normal state upon reception of the third synchronization frame transmitted from the SERDES transmitter.

A first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

Specifically, the first synchronization frame, the second synchronization frame and the third synchronization frame all can be called as a synchronization frame. In the embodiment, in additional to the synchronization frames transmitted between the SERDES transmitter and the SERDES receiver, data frames are further transmitted. The synchronization frames and the data frames can be called as private frames in the embodiment. As shown in FIG. 3, the frame structure of the private frame includes: the FH, an FC, an FP and a CRC. It is assumed that the bit width of a SERDES interface is 16 bits, and the FP is preferably set such that a length of the data frame may exactly divide the bit width and the requirement of a system on a rate can be met. According to an embodiment, the FP may be 32 bytes. As shown in table 1, when the private frame is the synchronization frame, the bit 15 of the FH is set into 0, which indicates that the current frame is the synchronization frame. When the private frame is the synchronization frame, the frame structure does not include an FP domain. When the private frame is the data frame, the bit 15 at the FH is set into 1, which indicates that the current frame is the data frame. The FP domain of the data frame is used to carry user data. In this embodiment, the CRC portion in the frame structure of the private frame is optional and is used to alarm. The CRC meets the following formula: G(x)=X16+X15+X2+1. No matter for the synchronization frame or the data frame, in the data structure, the bit 8 and the bit 7 of the FH carry a tag that indicates whether being synchronized. In this embodiment, the bit 8 is used to indicate that a SERDES receiving path of the local terminal has been in character synchronization, whereas the bit 7 is used to indicate that a SERDES receiving path of the peer terminal has been in character synchronization, such that the SERDES transmitter and the SERDES receiver both may determine that whether the receiving path and the transmitting path of the SERDES transmitter and the SERDES receiver are in the normal state and therefore the transmission of the SERDES is more stable and reliable.

According to an embodiment of the disclosure, in the process of transmitting the user data by means of the SERDES path, namely when the data frames are transmitted from the SERDES transmitter, the user data are encapsulated using the frame structure shown in table 1. That is, a tag that indicates whether the local terminal and the peer terminal are synchronized is arranged in the data frame, such that a user determines whether the current SERDES transmitter or SERDES receiver has been synchronized in the data transmission process, thereby guaranteeing the stability and the reliability of the data transmission.

According to an embodiment, the SERDES transmitter is configured to transmit a plurality of the first synchronization frames and K codes in a manner of alternating one of the first synchronization frames with one of the K codes.

The SERDES receiver is configured to judge whether the receiving path is in the normal state based on whether the K codes are decoded.

Specifically, the SERDES transmitter can transmit a plurality of the synchronization frames (it is the first synchronization frames in the embodiment and also may be the second synchronization frames or the third synchronization frames in other implementation modes) and the K codes in a manner of alternating one of the synchronization frames and one of the K codes. For example, the synchronization frame, the K code, the synchronization frame, and the K code are transmitted alternately in this order. When the SERDES receiver perform decoding, whether the character boundary is correct in the transmission process (namely in a serial-parallel conversion process) is judged based on whether the K codes are obtained by the decoding. If the K codes are obtained by the decoding, it is determined that the character boundary in the transmission process is correct. If the K codes are not obtained by the decoding, it is determined that the character boundary in the transmission process is incorrect and there is a need to move one frame length backward, After a response time, it is continued to judge whether the K codes are obtained by decoding till the K codes are obtained successfully.

It should be understood by those skilled in the art that the functions of each node in the transmission checking system in the embodiment of the disclosure can be understood by referring to related description on the foregoing transmission checking method of the SERDES. Each of the nodes in the transmission checking system of the SERDES in the embodiment of the disclosure can be implemented by an analog circuit implementing the functions of the embodiment of the disclosure, and also may be implemented by an operation of software executing the functions of the embodiment of the disclosure on an intelligent terminal.

Embodiment 6

Figure 7:
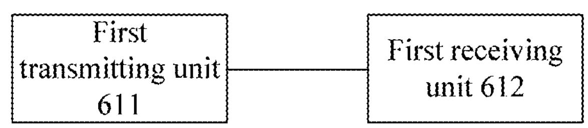
FIG. 7 is a schematic diagram of a compositional structure of a SERDES transmitter in an embodiment of the disclosure.

The embodiments of the disclosure further provide a SERDES transmitter. FIG. 7 is a schematic diagram of a compositional structure of a SERDES transmitter in an embodiment of the disclosure. As shown in FIG. 7, the SERDES transmitter includes: a first transmitting unit and a first receiving unit.

The first transmitting unit is configured to transmit a first synchronization frame to a SERDES receiver, and is further configured to transmit a third synchronization frame to the SERDES receiver upon that the first receiving unit receives a second synchronization frame.

The first receiving unit is configured to receive the second synchronization frame transmitted from the SERDES receiver.

A first identification tag and a second identification tag are provided in an FH of each of the first synchronization frame, the second synchronization frame and the third synchronization frame. When the first identification tag is set to be a preset value, it is indicated that a receiving path of a local terminal is in the normal state. When the second identification tag is set to be a preset value, it is indicated that a receiving path of a peer terminal is in the normal state.

Specifically, the first synchronization frame, the second synchronization frame and the third synchronization frame all can be called as a synchronization frame. In the embodiment, in additional to the synchronization frames transmitted between the SERDES transmitter and the SERDES receiver, data frames are further transmitted. The synchronization frames and the data frames can be called as private frames in the embodiment. As shown in FIG. 3, the frame structure of the private frame includes: the FH, an FC, an FP and a CRC. It is assumed that the bit width of a SERDES interface is 16 bits, and the FP is preferably set such that a length of the data frame may exactly divide the bit width and the requirement of a system on a rate can be met. In the embodiment, the FP may be 32 bytes. As shown in table 1, when the private frame is the synchronization frame, the bit 15 of the FH is set into 0, which indicates that the current frame is the synchronization frame. When the private frame is the synchronization frame, the frame structure does not include an FP domain. When the private frame is the data frame, the bit 15 at the FH is set into 1, which indicates that the current frame is the data frame. The FP domain of the data frame is used to carry user data. In the embodiment, the CRC portion in the frame structure of the private frame is an optional and is used to alarm. The CRC meets the following formula: G(x)=X16+X15+X2+1. No matter for the synchronization frame or the data frame, in the data structure, the bit 8 and the bit 7 of the FH carry a tag that indicates whether being synchronized. In the embodiment, the bit 8 is used to indicate that a SERDES receiving path of the local terminal has been in character synchronization, whereas the bit 7 is used to indicate that a SERDES receiving path of the peer terminal has been in character synchronization, such that the SERDES transmitter and the SERDES receiver both may determine that whether the receiving path and the transmitting path of the SERDES transmitter and the SERDES receiver are in the normal state and therefore the transmission of the SERDES is more stable and reliable.

According to an embodiment, the first transmitting unit is further configured to encapsulate the user data using the frame structure shown in table 1 when the data frames are transmitted. That is, a tag that indicates whether the local terminal and the peer terminal are synchronized is arranged in the data frame, such that a user determines whether the current SERDES transmitter or SERDES receiver has been synchronized in the data transmission process, thereby guaranteeing the stability and the reliability of the data transmission.

According to an embodiment, the first transmitting unit is further configured to transmit a plurality of the first synchronization frames and K codes to the receiver in a manner of alternating one of the first synchronization frames with one of the K codes. Therefore, when the receiver perform decoding, whether the character boundary is correct in the transmission process (namely in a serial-parallel conversion process) is judged based on whether the K codes are obtained by the decoding.

Specifically, the first transmitting unit can transmit a plurality of the synchronization frames (it is the first synchronization frames in the embodiment and also may be the second synchronization frames or the third synchronization frames in other implementation modes) and the K codes in a manner of alternating one of the synchronization frames with one of the K codes. For example, the synchronization frame, the K code, the synchronization frame, and the K code are transmitted alternately in this order. When the SERDES receiver decodes, whether the character boundary is correct in the transmission process (namely in a serial-parallel conversion process) is judged based on whether the K codes are obtained by the decoding. If the K codes are obtained by the decoding, it is determined that the character boundary in the transmission process is correct. If the K codes are not obtained by the decoding, it is determined that the character boundary in the transmission process is incorrect and there is a need to move one frame length backward. After a response time, it is continued to judge whether the K codes are obtained by the decoding till the K codes are obtained successfully.

It should be understood by those skilled in the art that the functions of each processing module in the SERDES transmitter in the embodiment of the disclosure can be understood by referring to related description on the foregoing transmission checking method of the SERDES. Each of the processing modules in the SERDES transmitter in the embodiment of the disclosure can be implemented by an analog circuit implementing the functions of the embodiment of the disclosure, and also may be implemented by an operation of software executing the functions of the embodiment of the disclosure on an intelligent terminal.

Embodiment 7

Figure 8:
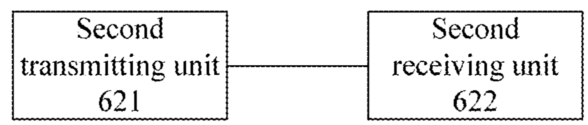
FIG. 8 is a schematic diagram of a compositional structure of a SERDES receiver in an embodiment of the disclosure.

The embodiments of the disclosure further provide a SERDES receiver. FIG. 8 is a schematic diagram of a compositional structure of a SERDES receiver in an embodiment of the disclosure. As shown in FIG. 8, the SERDES receiver includes: a second transmitting unit and a second receiving unit.

The second receiving unit is configured to receive a first synchronization frame transmitted from a SERDES transmitter, and is further configured to receive a third synchronization frame transmitted from the SERDES transmitter.

The second transmitting unit is configured to transmit a second synchronization frame to the SERDES transmitter upon that the second receiving unit receives the first synchronization frame.

A first identification tag and a second identification tag are provided in an FH of each of the first synchronization frame, the second synchronization frame and the third synchronization frame. When the first identification tag is set to be a preset value, it is indicated that the receiving path of a local terminal is in the normal state. When the second identification tag is set to be a preset value, it is indicated that the receiving path of a peer terminal is in the normal state.

Specifically, the first synchronization frame, the second synchronization frame and the third synchronization frame all can be called as a synchronization frame. In the embodiment, in additional to the synchronization frames transmitted between the SERDES transmitter and the SERDES receiver, data frames are further transmitted. The synchronization frames and the data frames can be called as private frames in the embodiment. As shown in FIG. 3, the frame structure of the private frame includes: the FH, an FC, an FP and a CRC. It is assumed that the bit width of a SERDES interface is 16 bits, and the FP is preferably set such that a length of the data frame may exactly divide the bit width and the requirement of a system on a rate can be met. According to an embodiment, the FP may be 32 bytes. As shown in table 1, when the private frame is the synchronization frame, the bit 15 of the FH is set into 0, which indicates that the current frame is the synchronization frame. When the private frame is the synchronization frame, the frame structure does not include an FP domain. When the private frame is the data frame, the bit 15 at the FH is set into 1, which indicates that the current frame is the data frame. The FP domain of the data frame is used to carry user data. In the embodiment, the CRC portion in the frame structure of the private frame is an optional and is used to alarm. The CRC meets the following formula: G(x)=X16+X15+X2+1. No matter for the synchronization frame or the data frame, in the data structure, the bit 8 and the bit 7 of the FH carry a tag that indicates whether being synchronized. In the embodiment, the bit 8 is used to indicate that a SERDES receiving path of the local terminal has been in character synchronization, whereas the bit 7 is used to indicate that a SERDES receiving path of the peer terminal has been in character synchronization, such that the SERDES transmitter and the SERDES receiver both may determine that whether the receiving path and the transmitting path of the SERDES transmitter and the SERDES receiver are in the normal state and therefore the transmission of the SERDES is more stable and reliable.

According to an embodiment, the second receiving unit is further configured to judge whether the receiving path is in the normal state based on whether the K codes are decoded.

Specifically, the SERDES transmitter can transmit a plurality of the synchronization frames (it is the first synchronization frames in the embodiment and also may be the second synchronization frames or the third synchronization frames in other implementation modes) and the K codes in a manner of alternating one of the synchronization frames with one of the K codes. For example, the synchronization frame, the K code, the synchronization frame, the K code are transmitted alternately in this order. When the second receiving unit perform decoding, whether the character boundary is correct in the transmission process (namely in a serial-parallel conversion process) is judged based on whether the K codes are obtained by the decoding. If the K codes are obtained by the decoding, it is determined that the character boundary in the transmission process is correct. If the K codes are not obtained by the decoding, it is determined that the character boundary in the transmission process is incorrect and there is a need to move one frame length backward. After a response time, it is continued to judge whether the K codes are obtained by the decoding till the K codes are obtained successfully.

It should be understood by those skilled in the art that the functions of each processing module in the SERDES receiver in the embodiment of the disclosure can be understood by referring to related description on the foregoing transmission checking method of the SERDES. Each of the processing modules in the SERDES receiver in the embodiment of the disclosure can be implemented by an analog circuit implementing the functions of the embodiment of the disclosure, and also may be implemented by an operation of software executing the functions of the embodiment of the disclosure on an intelligent terminal.

In the sixth embodiment and the seventh embodiment of the disclosure, the SERDES transmitter and the SERDES receiver can be implemented using a node device of a SERDES interface in an actual application. The first transmitting unit and the first receiving unit in the SERDES transmitter can be implemented by a transmitting-receiving antenna or a transmitting-receiving machine in the SERDES transmitter in the actual application. The second transmitting unit and the second receiving unit in the SERDES receiver can be implemented by a transmitting-receiving antenna or a transmitting-receiving machine in the SERDES receiver in the actual application.

In the several embodiments provided in the disclosure, it should be understood that the devices and methods disclosed can be implemented in other ways. The device embodiments described above are merely exemplary, for example, the classification of the elements is merely a classification of logic functions, and in practice implementations, there are other classification ways. For example, some of the elements or components may be combined or integrated into other system, or some features may be omitted or unexecuted. Moreover, coupling or direct coupling or communication connection between the components illustrated or discussed herein may be indirect coupling or communication connection of devices or elements by some interfaces or may be electric connection, mechanical connection or the other forms of connection.

The elements described as separate components may be or may be not physically separated, and the components illustrated as elements may be or may be not physical elements, i.e., they may be located at one place or distributed in a plurality of network elements. Moreover, some of or all the elements may be selected according to actual demands to implement the purpose of the embodiments of the disclosure.

In addition, the functional elements involved in the embodiments of the disclosure may be all integrated into a processing element or each of the elements may be act as a unit separately, or two or more than two of these elements may be integrated into one unit; the integrated element described above may be implemented in the form of hardware or may be implemented in the form of hardware plus software function elements.

It should be appreciated understood by those of ordinary skill in the art that all or some of or all the steps of the foregoing method embodiments can be implemented by program instruction related hardware. The program described above may be stored in a computer-readable storage medium. The program, when executed, executes the step of the method embodiments described above. The storage medium described above includes a mobile hard disk drive, a Read-Only Memory (ROM), a Random Access Memory (RAM), a disk, a compact disc or another medium capable of storing program codes.

Alternatively, if being implemented in form of a software function module and sold or used as an independent product, the integrated elements of the disclosure may be stored in a computer-readable storage medium. Based on such an understanding, the technical solutions of the embodiment of the disclosure substantially or a part with contributions to the conventional art may be embodied in form of software product, and the computer software product is stored in a storage medium, including a plurality of instructions arranged to enable a computer (which may be a personal computer, a server, a network device or the like) to execute all or part of the method in each embodiment of the disclosure. The preceding storage medium includes: various media capable of storing program codes such as a mobile storage device, an ROM, an RAM, a magnetic disk or a compact disc.

The above description is only specific embodiments of the disclosure and the protection scope of the disclosure is not limited to this. It may be readily conceivable for those skilled in the art to have changes and modifications in the technical scope of the disclosure, and all should be included in protection scope of the disclosure. Therefore, the protection scope of the disclosure should be subjected to the protection scope of the appended claims.

INDUSTRIAL APPLICABILITY

According to the technical solutions of the embodiments of the disclosure, through three handshaking processes of mutually transmitting the three synchronization frames by the two SERDES terminals, each of the SERDES transmitter and the SERDES receiver can determine whether the receiving path and the transmitting path of the SERDES transmitter/the SERDES receiver are in the normal state. Therefore, the security of the data transmission is greatly improved, the SERDES path is guaranteed to be stable, and the experience of a user is improved.

The invention claimed is:

1. A transmission checking method, comprising:

transmitting, by a SERializer/DESerializer (SERDES) transmitter, a first synchronization frame to a SERDES receiver;

upon reception of a second synchronization frame transmitted from the SERDES receiver, determining, by the SERDES transmitter, that each of a transmitting path and a receiving path of the SERDES transmitter is in a normal state; and transmitting, by the SERDES transmitter, a third synchronization frame to the SERDES receiver;

wherein a first identification tag and a second identification tag are provided in a Frame Header (FH) of each of the first synchronization frame, the second synchronization frame and the third synchronization frame; when the first identification tag is set to be a preset value, it is indicated that a receiving path of a local terminal is in a normal state; and when the second identification tag is set to be a preset value, it is indicated that a receiving path of a peer terminal is in a normal state.

2. A transmission checking method, comprising:

upon reception of a first synchronization frame transmitted from a SERDES transmitter, transmitting, by a SERializer/DESerializer (SERDES) receiver, a second synchronization frame to the SERDES transmitter; and upon reception of a third synchronization frame transmitted from the SERDES transmitter, determining, by the SERDES receiver, that each of a transmitting path and a receiving path of the SERDES receiver is in a normal state;

wherein a first identification tag and a second identification tag are provided in a Frame Header (FH) of each of the first synchronization frame, the second synchronization frame and the third synchronization frame; when the first identification tag is set to be a preset value, it is indicated that a receiving path of a local terminal is in a normal state; and when the second identification tag is set to be a preset value, it is indicated that a receiving path of a peer terminal is in a normal state.

3. The method according to claim 2, further comprising:

transmitting, by the SERDES transmitter, the first synchronization frame to the SERDES receiver; and upon reception of the second synchronization frame, determining, by the SERDES transmitter, that each of a transmitting path and a receiving path of the SERDES transmitter is in a normal state, and transmitting the third synchronization frame to the SERDES receiver.

4. The method according to claim 3, wherein the transmitting, by the SERDES transmitter, the first synchronization frame to the SERDES receiver comprises: transmitting, by the SERDES transmitter, a plurality of the first synchronization frames and K codes in a manner of alternating one of the first synchronization frames with one of the K codes; and correspondingly, judging, by the SERDES receiver, whether the receiving path of the SERDES receiver is in the normal state based on whether the K codes are decoded.

5. A SERializer/DESerializer (SERDES) transmitter, comprising a processor and a memory for storing instructions executable for the processor; wherein when the instructions are executed by the processor, the processor is configured to:

transmit a first synchronization frame to a SERDES receiver;

transmit a third synchronization frame to the SERDES receiver upon a second synchronization frame being received; and receive the second synchronization frame transmitted from the SERDES receiver;

wherein a first identification tag and a second identification tag are provided in a Frame Header (FH) of each of the first synchronization frame, the second synchronization frame and the third synchronization frame; when the first identification tag is set to be a preset value, it is indicated that a receiving path of a local terminal is in a normal state; and when the second identification tag is set to be a preset value, it is indicated that a receiving path of a peer terminal is in a normal state.

6. A SERializer/DESerializer (SERDES) receiver, comprising a processor and a memory for storing instructions executable for the processor; wherein when the instructions are executed by the processor, the processor is configured to:

receive a first synchronization frame transmitted from a SERDES transmitter;

transmit a second synchronization frame to the SERDES transmitter upon reception of the first synchronization frame; and receive a third synchronization frame transmitted from the SERDES transmitter;

wherein a first identification tag and a second identification tag are provided in a Frame Header (FH) of each of the first synchronization frame, the second synchronization frame and the third synchronization frame; when the first identification tag is set to be a preset value, it is indicated that a receiving path of a local terminal is in a normal state; and when the second identification tag is set to be a preset value, it is indicated that a receiving path of a peer terminal is in a normal state.

* * * * *